US011242934B2

(12) United States Patent
Kondo et al.

(10) Patent No.: US 11,242,934 B2
(45) Date of Patent: Feb. 8, 2022

(54) VALVE DEVICE

(71) Applicant: FUJIKIN INCORPORATED, Osaka (JP)

(72) Inventors: Kenta Kondo, Osaka (JP); Toshihide Yoshida, Osaka (JP); Masahiko Takimoto, Osaka (JP); Tsutomu Shinohara, Osaka (JP); Tomohiro Nakata, Osaka (JP); Takeru Miura, Osaka (JP); Masahiko Nakazawa, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 16/971,371

(22) PCT Filed: Mar. 9, 2018

(86) PCT No.: PCT/JP2018/009297
§ 371 (c)(1),
(2) Date: Aug. 20, 2020

(87) PCT Pub. No.: WO2019/171593
PCT Pub. Date: Sep. 12, 2019

(65) Prior Publication Data
US 2020/0393051 A1 Dec. 17, 2020

(51) Int. Cl.
F16K 31/00 (2006.01)
F16K 31/126 (2006.01)
(Continued)

(52) U.S. Cl.
CPC .......... F16K 7/17 (2013.01); C23C 16/45544 (2013.01); C23C 16/45561 (2013.01);
(Continued)

(58) Field of Classification Search
CPC ...... F16K 7/17; F16K 31/007; F16K 31/1266; F16K 31/122; F16K 31/124; F16K 31/02;
(Continued)

(56) References Cited

U.S. PATENT DOCUMENTS 6,932,278 B2 * 8/2005 Reiter .................. F02M 61/167
239/102.2
8,096,522 B2 * 1/2012 Bachmaier ......... G05D 16/2097
251/30.02
(Continued)

FOREIGN PATENT DOCUMENTS

JP 2006-507601 3/2006
JP 2007-64333 A 3/2007
(Continued)

OTHER PUBLICATIONS

International Search Report issued in International Patent Application No. PCT/JP2018/009297, dated May 15, 2018.
(Continued)

Primary Examiner — William M McCalister
(74) Attorney, Agent, or Firm — Greenblum & Bernstein, P.L.C.

(57) ABSTRACT

Provided is a valve device which can precisely adjust the flow rate while ensuring the flow rate of the fluid. A valve device includes a main actuator which receives a pressure of a supplied drive fluid and moves an operating member to an open position or closed position; an adjusting actuator arranged to receive at least a part of a force generated by the main actuator and for adjusting the position of the operating member positioned at the open position; and a pressure regulator provided in a feed path of the drive fluid to the main actuator and for regulating the pressure of the supplied drive fluid to suppress fluctuation of the pressure of the drive fluid supplied to the main actuator.

7 Claims, 10 Drawing Sheets

(51) Int. Cl.
  *F16K 31/122* (2006.01)
  *F16K 31/02* (2006.01)
  *F16K 31/124* (2006.01)
  *F16K 7/17* (2006.01)
  *C23C 16/455* (2006.01)
  *H01L 21/67* (2006.01)

(52) U.S. Cl.
  CPC ........ *F16K 31/007* (2013.01); *F16K 31/1266* (2013.01); *H01L 21/67017* (2013.01); *F16K 31/004* (2013.01); *F16K 31/02* (2013.01); *F16K 31/122* (2013.01); *F16K 31/124* (2013.01)

(58) Field of Classification Search
  CPC . F16K 31/004; F16K 17/02; C23C 16/45544; C23C 16/45561; H01L 21/67017; Y10T 137/7762–777
  USPC .............................. 137/488–492.5; 251/25–47
  See application file for complete search history.

(56) References Cited

U.S. PATENT DOCUMENTS

| | | | | |
|---|---|---|---|---|
| 8,783,652 | B2* | 7/2014 | Dinh ................. | H01L 21/02104 251/129.06 |
| 2004/0100385 | A1 | 5/2004 | Hansen et al. | |
| 2005/0253100 | A1* | 11/2005 | Yasue ....................... | F16K 7/17 251/63 |
| 2011/0232986 | A1 | 9/2011 | Nording et al. | |
| 2011/0315905 | A1* | 12/2011 | Hirose .................... | F16L 23/20 251/12 |
| 2012/0180475 | A1 | 7/2012 | Shimizu et al. | |
| 2013/0233395 | A1 | 9/2013 | Dinh et al. | |
| 2015/0184771 | A1* | 7/2015 | Chen .................. | B29C 49/4289 251/30.01 |
| 2015/0375670 | A1* | 12/2015 | Beard ..................... | B60P 7/065 222/3 |
| 2016/0069471 | A1* | 3/2016 | Ewers ................. | F16K 31/1221 137/489 |

FOREIGN PATENT DOCUMENTS

| | | |
|---|---|---|
| JP | 2011-101581 | 5/2011 |
| JP | 2011-201531 | 10/2011 |
| JP | 2013-210095 | 10/2013 |
| JP | 2016-121776 A | 7/2016 |
| WO | 2004/079243 A1 | 9/2004 |

OTHER PUBLICATIONS

Written Opinion issued in International Patent Application No. PCT/JP2018/009297, dated May 15, 2018.
Japan Office Action received in JP Application No. 2020-504636, dated Nov. 22, 2021.

* cited by examiner

[fig.1A]
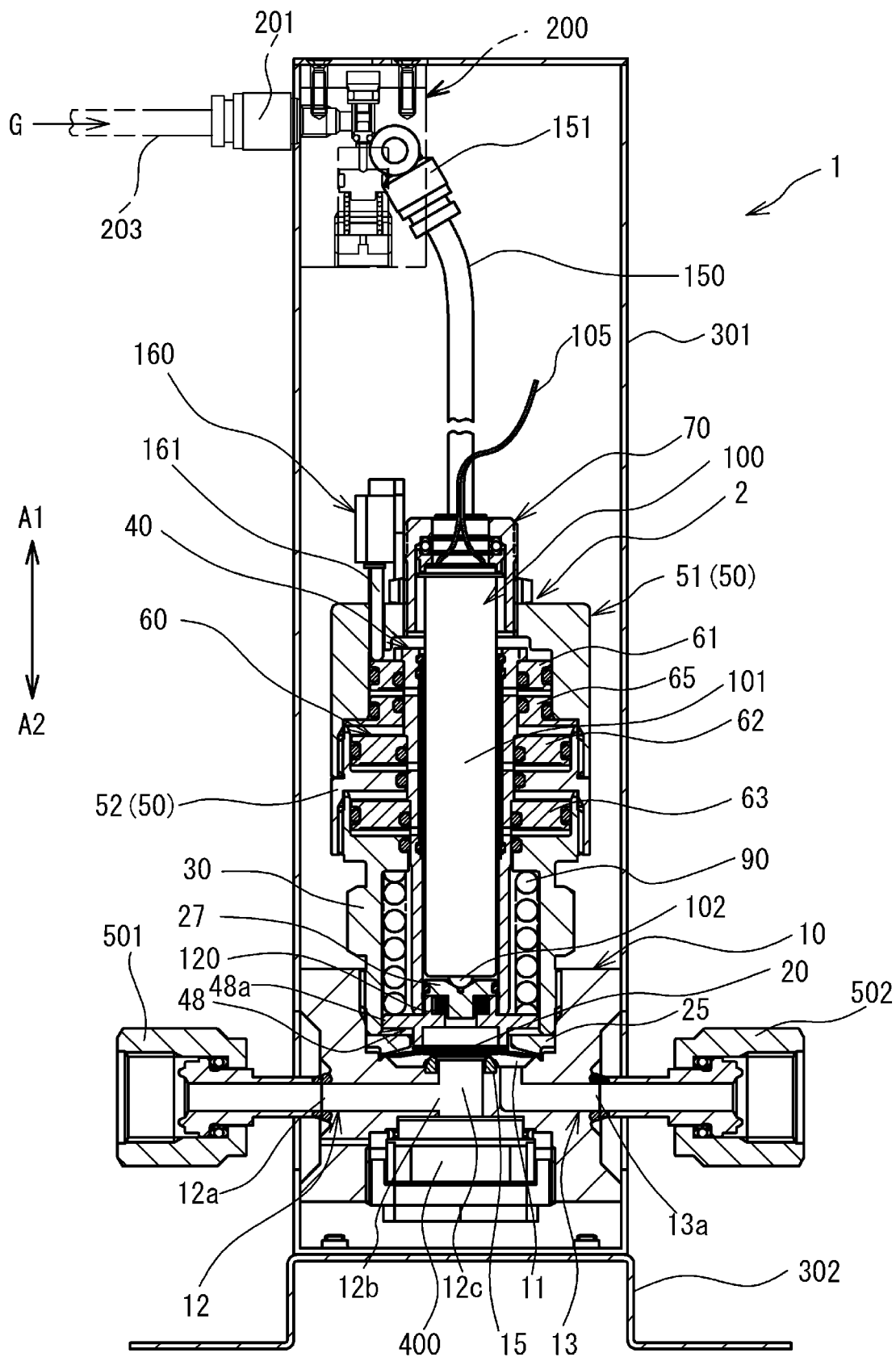

[fig.1B]
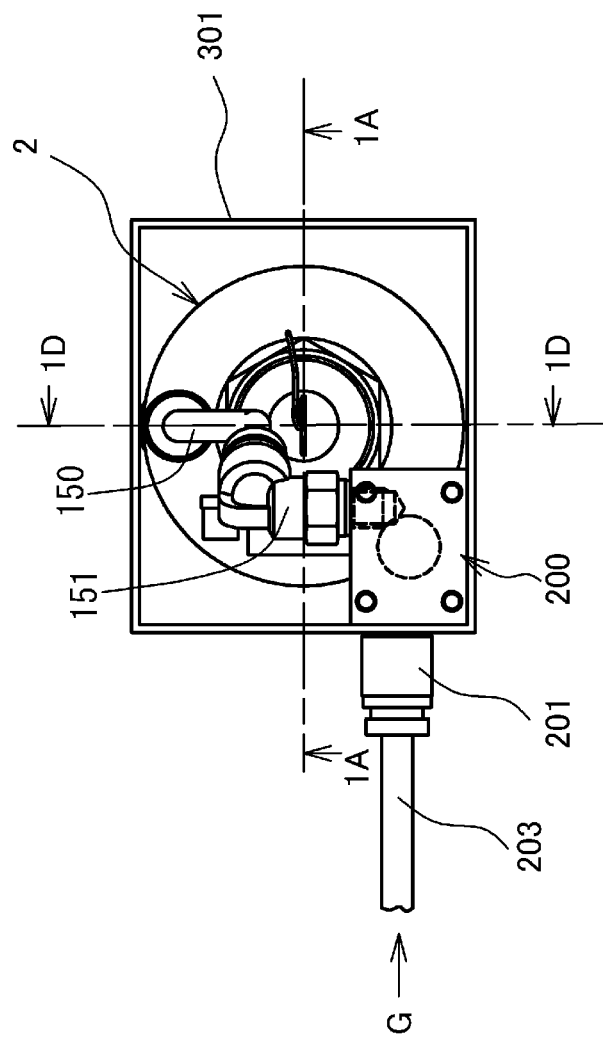

[fig.1C]
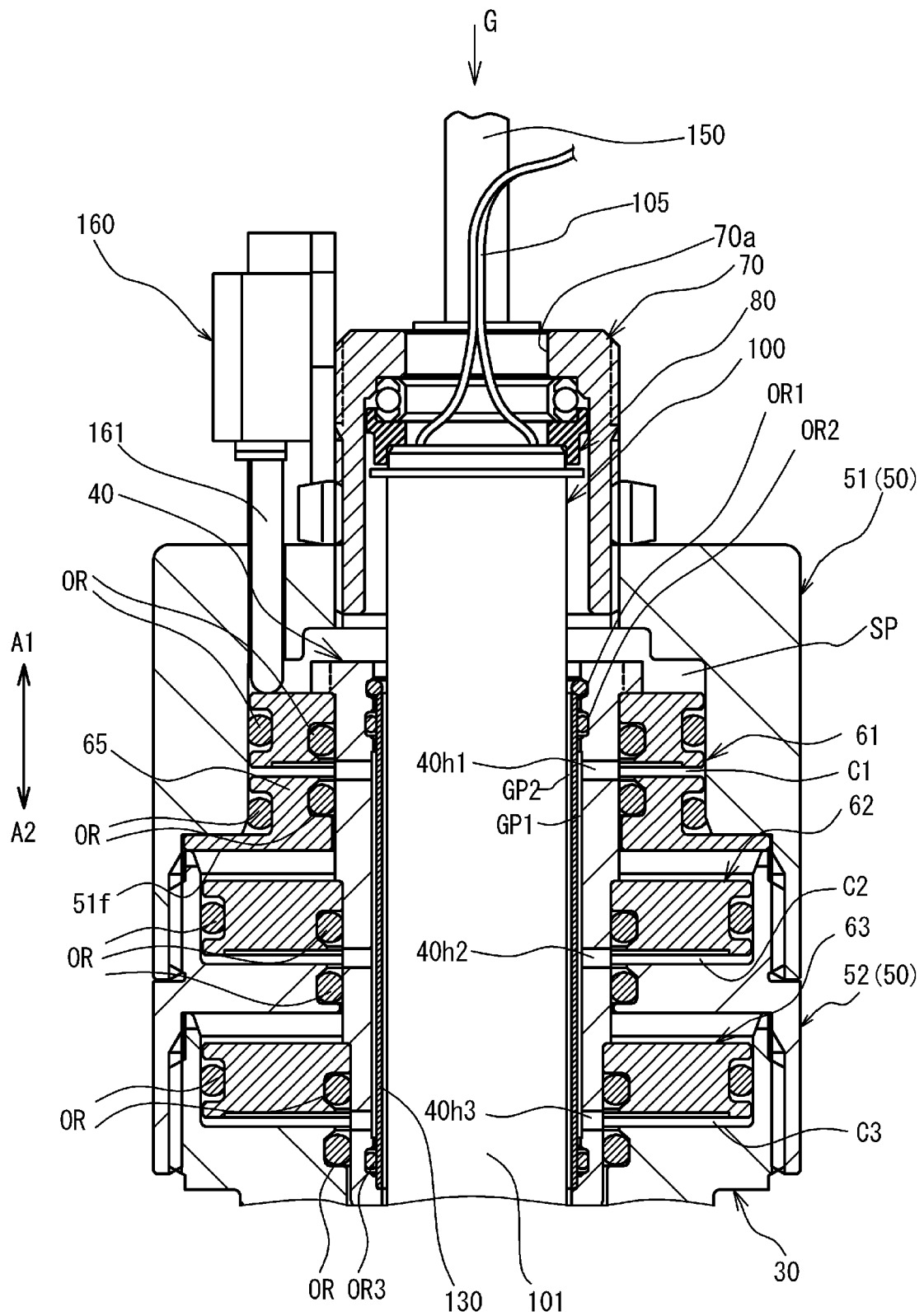

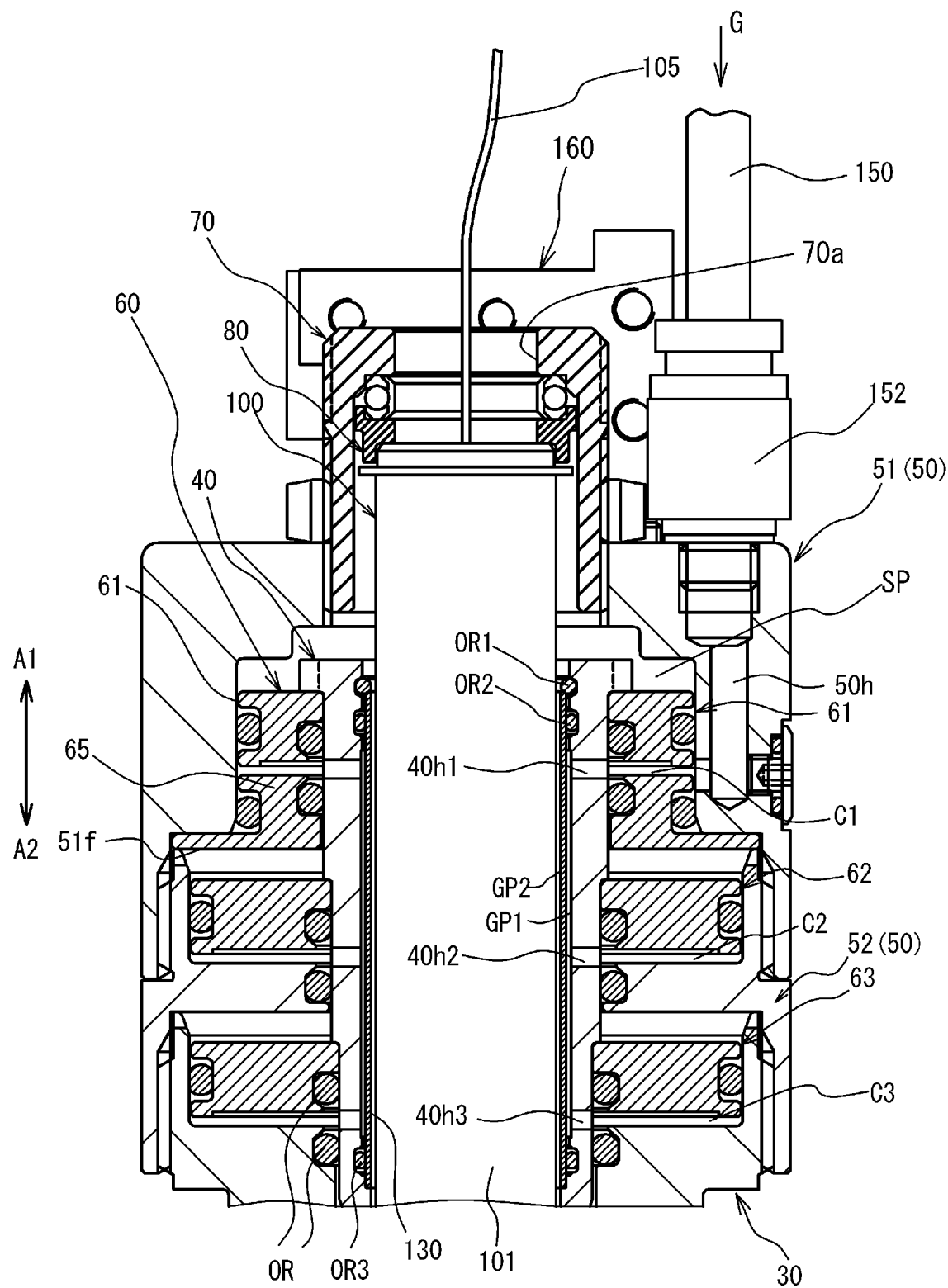
[fig.1D]

[fig.2]
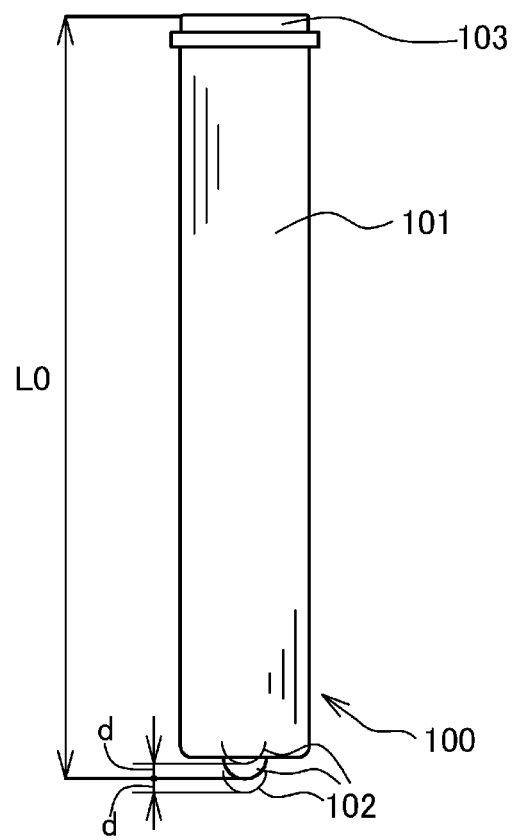

[fig.3]
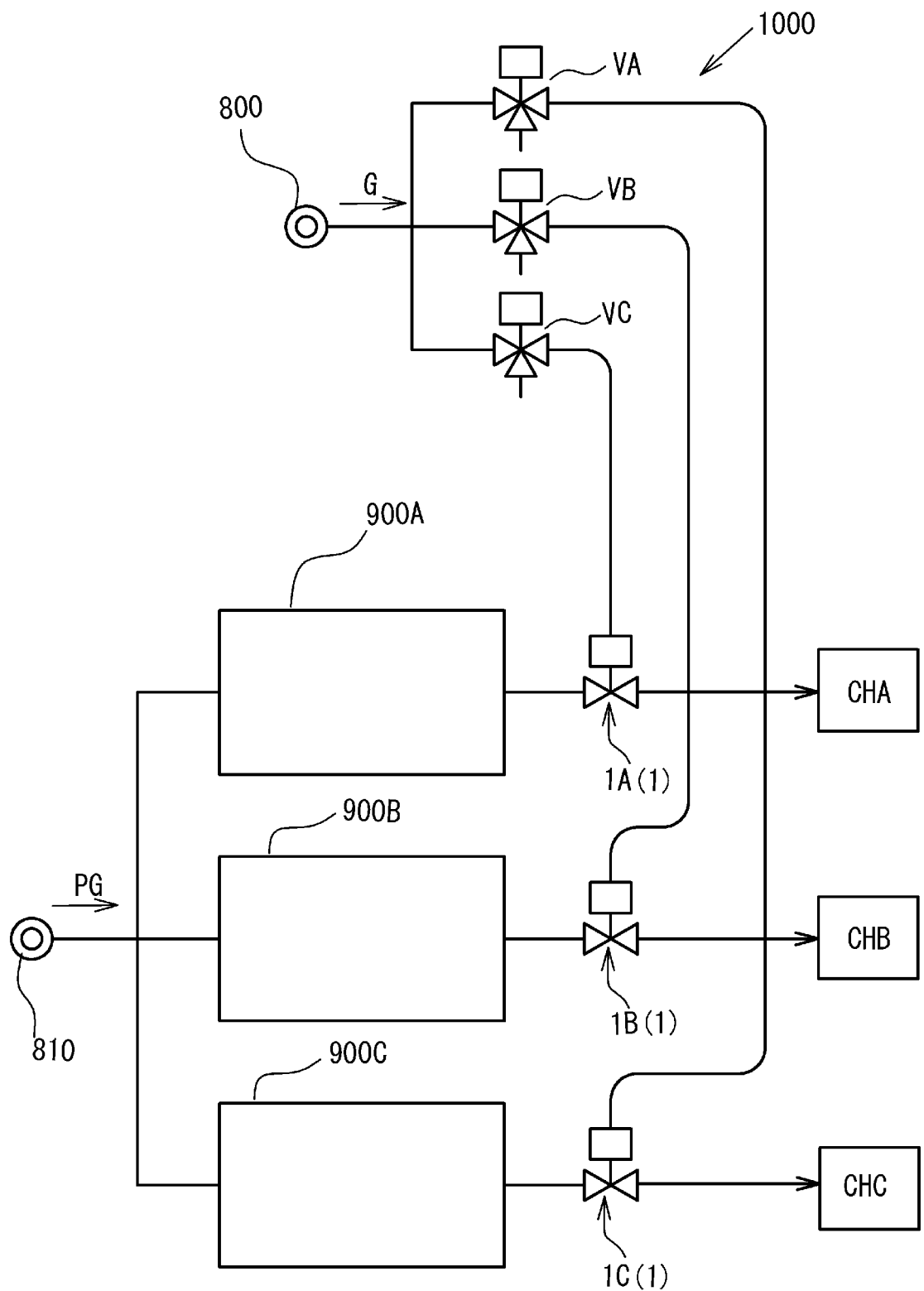

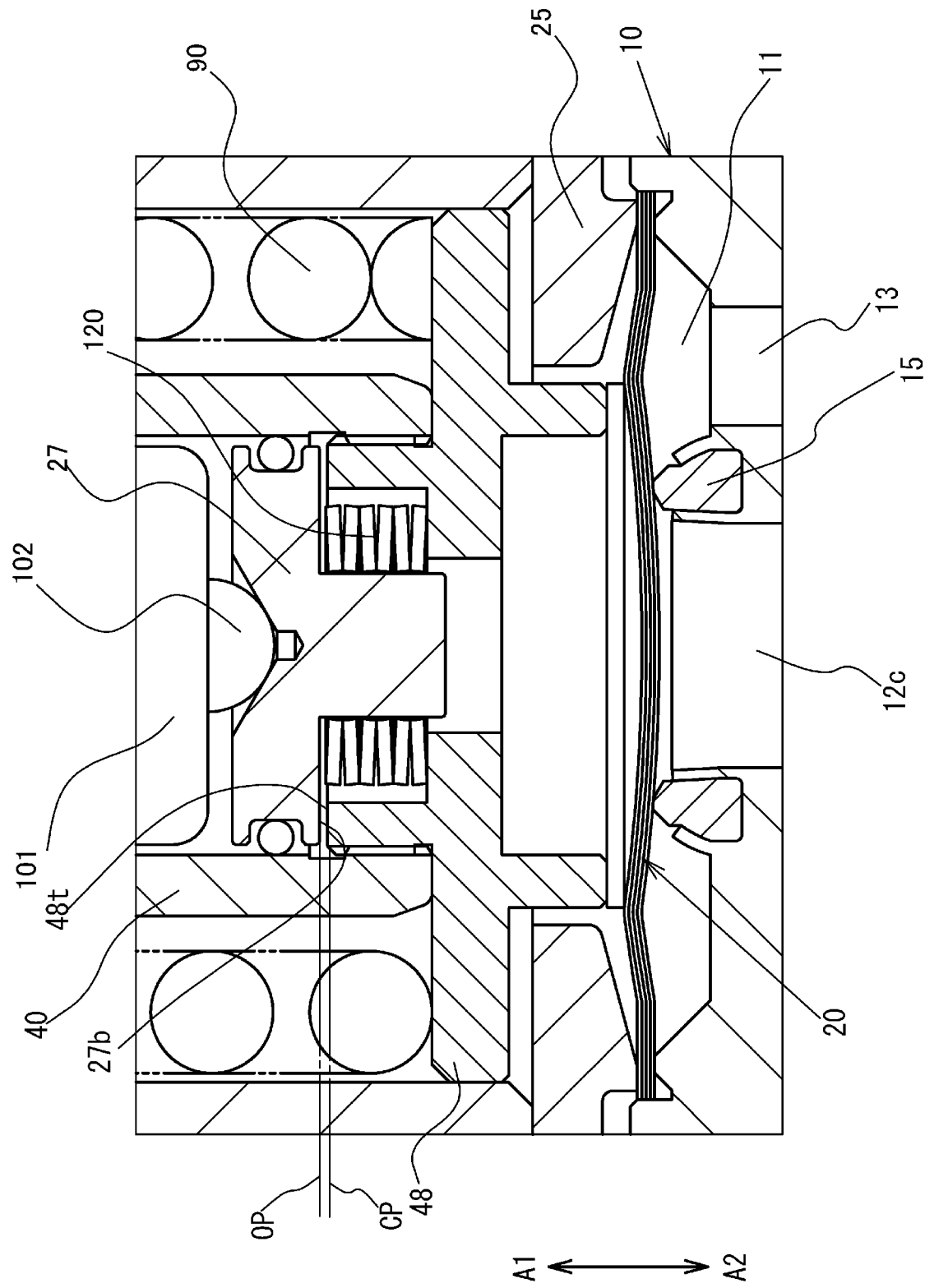

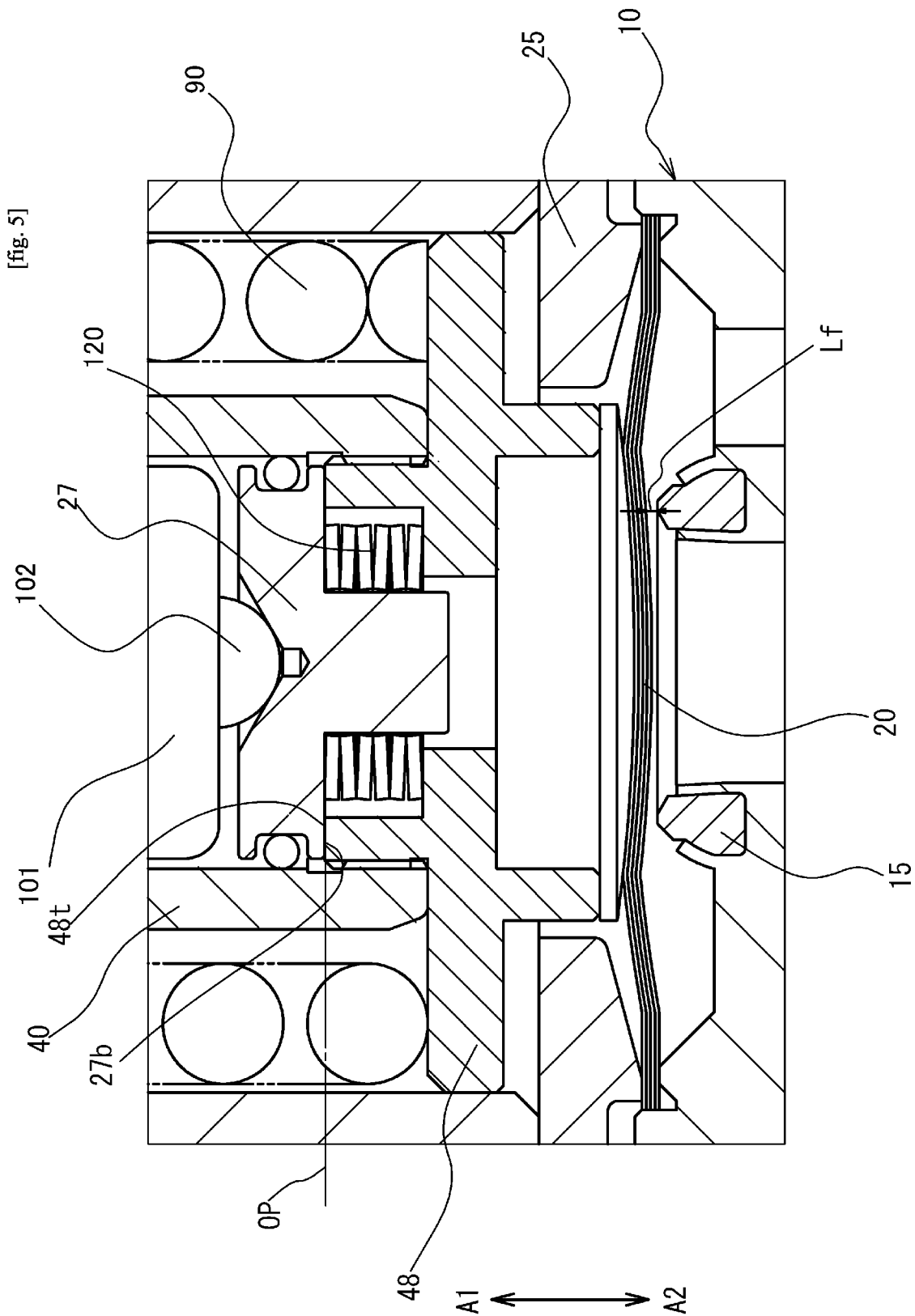

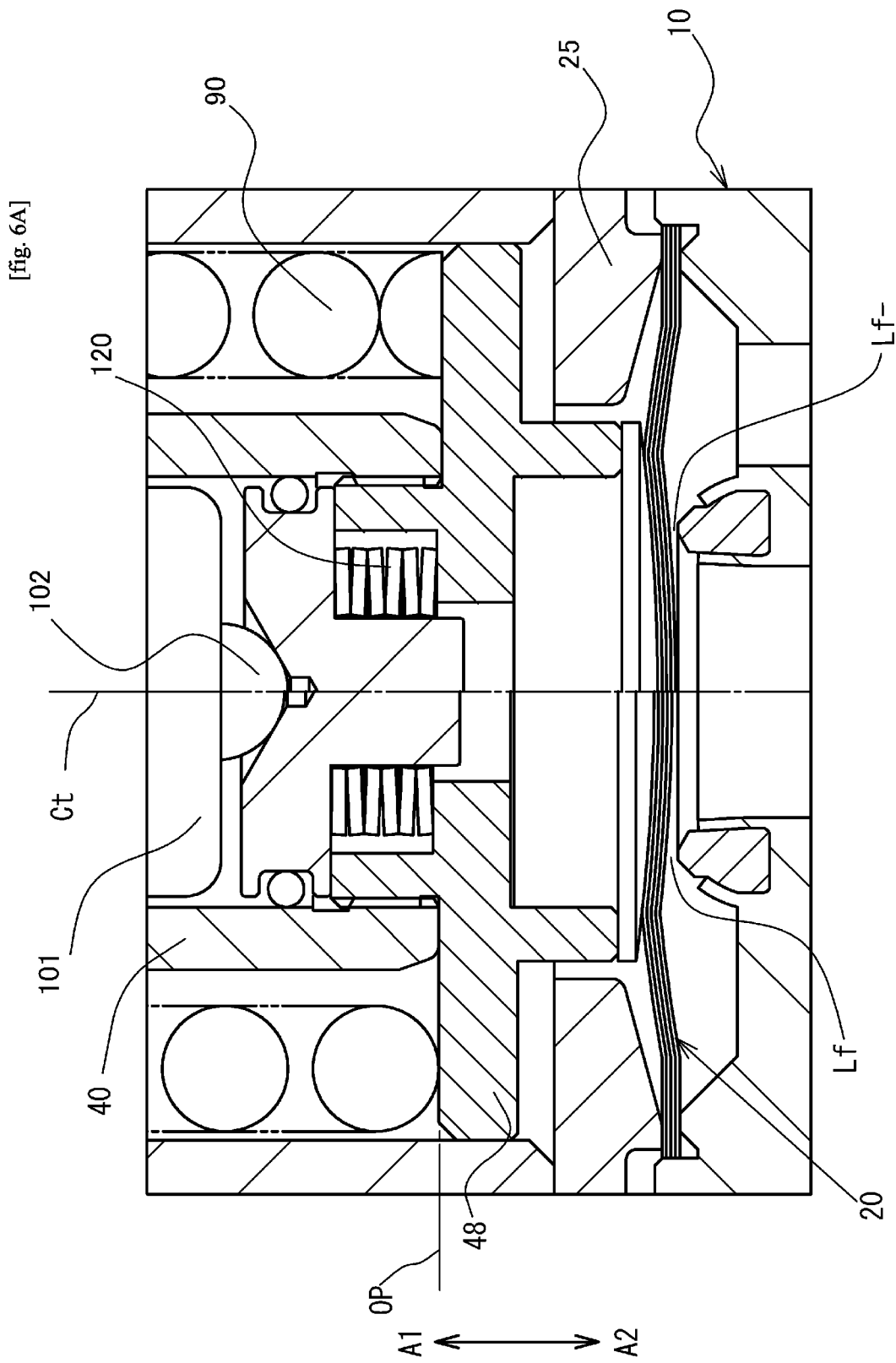

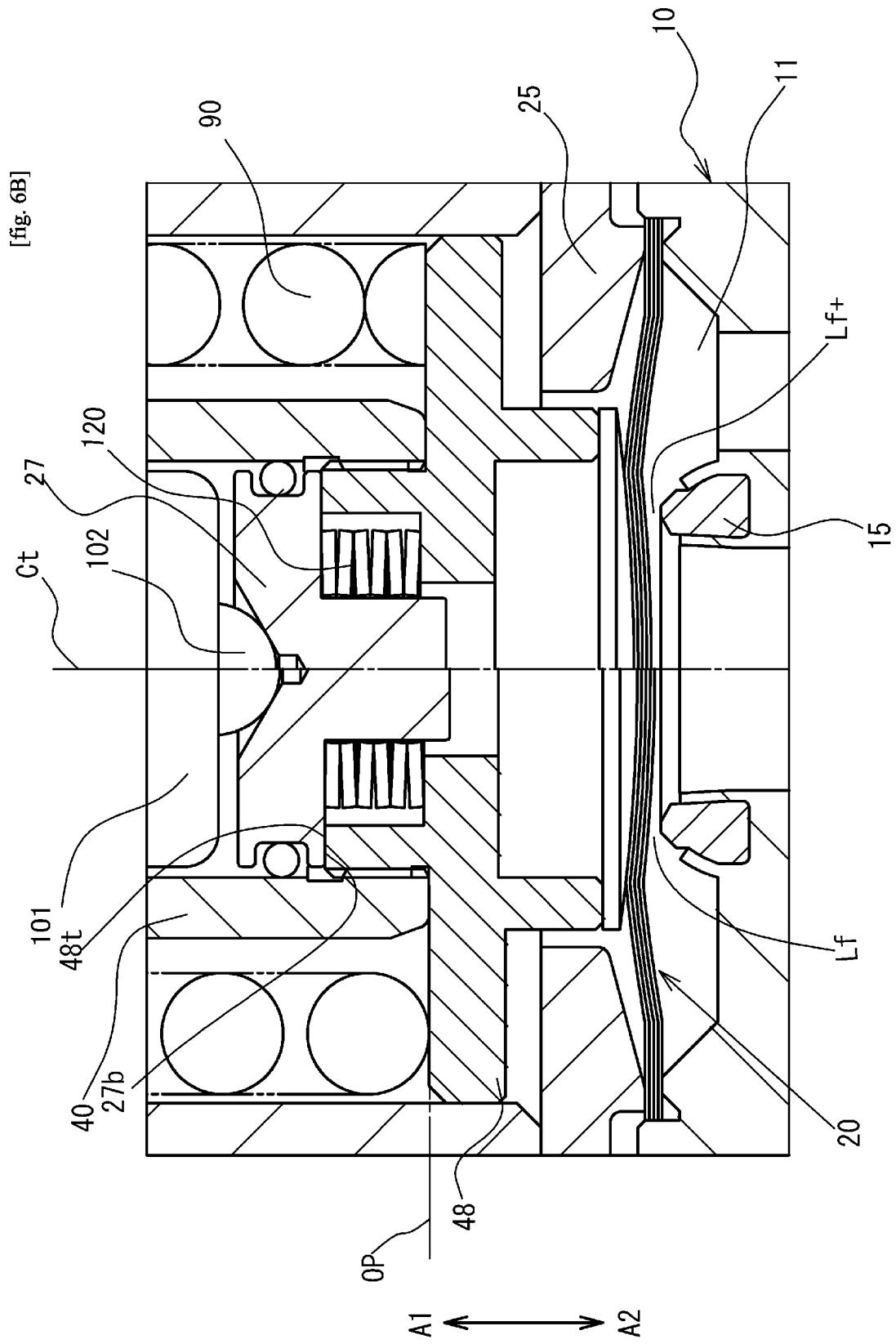

VALVE DEVICE

TECHNICAL FIELD

The present disclosure relates to a valve device.

BACKGROUND ART

In semiconductor manufacturing processes, in order to supply an accurately metered process gas to a processing chamber, a fluid control device called integrated gas system integrating various fluid control devices such as an open-close valve, a regulator, a mass flow controller is used.

Usually, the process gas outputted from the above fluid control device is directly supplied to the processing chamber, but in a processing process of depositing a film on a substrate by an atomic layer deposition (ALD) method, in order to stably supply the process gas, the process gas supplied from the fluid control device is temporarily stored in the tank as a buffer, and the valves provided in the immediate vicinity of the processing chamber are frequently opened and closed to supply the process gas from the tank to the processing chamber in a vacuum atmosphere. As valves provided in the immediate vicinity of the process chamber, see, for example, Patent Literatures 1 and 2.

The ALD method is one of chemical vapor deposition methods, in which two or more types of process gases are alternately flowed on the substrate surface under film forming conditions such as temperature and time to react with atoms on a substrate surface to deposit a film layer by layer, and since every monoatomic layer can be controlled, a uniform film thickness can be formed and a film can be grown very densely as a film quality.

In the semiconductor manufacturing process by the ALD method, it is necessary to precisely adjust the flow rate of the process gas, and along with increase in the diameter of the substrate or the like, it is also necessary to secure a certain amount of flow rate of the process gas.

PATENT LITERATURE

PTL 1: Japanese Laid-Open Patent Application No. 2007-64333
PTL 2: Japanese Laid-Open Patent Application No. 2016-121776

SUMMARY OF INVENTION

Technical Problem

However, with an air-operated valve, it is not easy to precisely adjust the flow rate by pneumatic adjustment or mechanical adjustment. Further, in the semiconductor manufacturing process by the ALD method, since the periphery of the processing chamber becomes high temperature, the valve tends to be influenced by temperature. Furthermore, since the valve is opened and closed at a high frequency, aging of the valve is likely to occur, and enormous man-hours of work is required for flow rate adjustment.

It is an object of the present invention to provide a valve device capable of precisely adjusting a flow rate while ensuring the flow rate of the fluid.

It is another object of the present invention to provide a valve device which can drastically reduce the number of steps of flow rate adjustment.

It is yet another object of the present invention to provide a valve device capable of immediately adjusting a flow rate.

Solution to Problem

A valve device according to the present invention comprises a valve body defining a flow path;
a valve element provided to opened and close the flow path of the valve body;
an operating member for operating the valve element, which is movably provided between a preset open position to make the valve element open the flow path and a preset closed position to make the valve element close the flow path;
a main actuator for moving the operating member to the open position or the closed position by receiving a pressure of a supplied drive fluid,
an adjusting actuator arranged to receive at least a part of a force generated by the main actuator, and for adjusting a position of the operating member positioned at the open position; and
a pressure stabilizing mechanism provided in a supply path of the drive fluid to the main actuator and for suppressing the fluctuation of the pressure of the drive fluid to be supplied to the main actuator.

Preferably, the pressure stabilizing mechanism includes a pressure regulator that regulates the pressure of the drive fluid to be supplied.

Preferably, the main actuator moves the operating member to the open position, and
the adjusting actuator receives the force of the main actuator acting on the operating member positioned at the open position at the tip end of the adjusting actuator to restrict the movement of the operating member and adjust the position of the operating member.

More preferably, the valve device comprises a casing incorporating the main actuator and the adjusting actuator, and
a flow passage formed in the casing and for supplying the drive fluid that has passed through the pressure stabilizing mechanism to the main actuator,
wherein the flow passage is formed separately so that the pressure of the drive fluid flowing through the flow passage does not to act on the adjusting actuator.

The adjusting actuator may have a drive source which expands and contracts in response to supply of electricity.

Preferably, the adjusting actuator includes an actuator utilizing expansion and contraction of a piezoelectric element.

Alternatively, the adjusting actuator may comprise an actuator having an electrically driven polymer as a drive source.

Advantageous Effects of Invention

According to the present invention, by providing an adjusting actuator in addition to the main actuator, it becomes possible to perform a precise adjustment operation of the flow rate, and to greatly reduce the flow rate adjustment man-hours. In addition, by providing the pressure stabilizing mechanism, it is possible to suppress the influence of the pressure fluctuation of the drive fluid on the adjusting actuator, and to realize a more accurate flow control.

BRIEF DESCRIPTION OF DRAWINGS

FIG. 1A is a longitudinal cross-sectional view of a valve device according to an embodiment of the present invention, taken along 1A-1A of FIG. 1B.

FIG. 1B is a top view of the valve device in FIG. 1A.

FIG. 1C is an enlarged cross-sectional view of the actuator portion of the valve device in FIG. 1A.

FIG. 1D is an enlarged cross-sectional view of the actuator portion along 1D-1D of FIG. 1B.

FIG. 2 is an explanatory view showing the operation of the piezoelectric actuator.

FIG. 3 is a schematic diagram illustrating an application of a valve device according to an embodiment of the present invention to a process gas control system of semiconductor manufacturing apparatus.

FIG. 4 is an enlarged cross-sectional view of the main part for explaining the fully closed state of valve device of FIG. 1A.

FIG. 5 is an enlarged cross-sectional view of the main part for explaining the fully open status of valve device in FIG. 1A.

FIG. 6A is an enlarged cross-sectional view of the main part for explaining the state when adjusting the flow rate of the valve device of FIG. 1A (when the flow rate is reduced).

FIG. 6B is an enlarged cross-sectional view of the main part for explaining the state when adjusting the flow rate of the valve device of FIG. 1B (when the flow rate is increased).

DESCRIPTION OF EMBODIMENTS

Embodiments of the present invention will be described below with reference to the drawings. In the present specification and the drawings, the same reference numerals are used to denote components having substantially the same functions, and thus repetitive descriptions thereof are omitted.

FIG. 1A is a cross-sectional view showing the configuration of valve device 1 according to an embodiment of the present invention, showing a condition in which the valve is fully closed. FIG. 1B is a top view of valve device 1, FIG. 1C is an enlarged longitudinal sectional view of the actuator portion of valve device 1, and FIG. 1D is an enlarged longitudinal sectional view of the actuator portion in a direction differing 90 degrees from 1C. In the following explanation, A1 in FIG. 1A is defined as an upward direction, and A2 is defined as a downward direction.

Valve device 1 has a housing box 301 provided on a support plate 302, a valve body 2 installed in the housing box 301, a pressure regulator 200 installed near the ceiling of the housing box 301, and a pressure sensor 400.

In FIGS. 1A to 1D, 10 denotes a valve body, 15 denotes a valve seat, 20 denotes a diaphragm, 25 denotes a presser adaptor, 27 denotes an actuator receiver, 30 denotes a bonnet, 40 denotes an operating member, 48 denotes a diaphragm presser, 50 denotes a casing, 60 denotes a main actuator, 70 denotes an adjusting body, 80 denotes an actuator presser, 90 denotes a coil spring, 100 denotes a piezoelectric actuator as an adjusting actuator, 120 denotes a disc spring, 130 denotes a partition member, 150 denotes a feed pipe, 160 denotes a limit switch, OR denotes an O-ring as a sealing member, and G denotes compressed air as a driving fluid. The driving fluid is not limited to compressed air, and other fluids may be used.

Valve body 10 is formed of a metal such as stainless steel and defines flow paths 12, 13. Flow path 12 has at one end an opening 12a which opens at one side surface of the valve body 10, and a pipe joint 501 is connected to the opening 12a by welding. Flow path 12 has the other end 12b connected to flow path 12c extending in the vertical directions A1, A2 of the valve body 10. The upper end portion of flow path 12c is open at the upper surface side of the valve body 10, the upper end portion is open at the bottom surface of the recess 11 formed on the upper surface side of the valve body 10, and the lower end portion is open at the lower surface side of the valve body 10.

Pressure sensor 400 is provided to the opening of the lower end side of flow path 12c, and closes the opening of the lower end side of flow path 12c. Pressure sensor 400 serves as a sensor for feedback during operation of adjusting actuator 100 (piezo). When the pressure sensor 400 is applied to the valve body 10, since the distance from the pressure sensor 400 to the valve body and the internal volume is reduced, the response of the feedback control to the adjusting actuator 100 is accelerated to improve the accuracy and speed of the stroke amount adjustment. Here, the installation location of the pressure sensor 400 is not limited thereto, and it is also possible to install outside the valve body 10. A configuration without using the pressure sensor 400 is also possible.

The locations of the openings of flow path 12 and 13 are not limited to the side surface of the valve body 10, and they can also be provided on a desired surface such as a bottom surface or a top surface.

A valve seat 15 is provided around the opening at the upper end of flow path 12c. Valve seat 15 is made of a synthetic resin (PFA, PA, PI, PCTFE, etc.), is fitted and fixed to the mounting groove provided around a peripheral edge of the opening of the upper end of flow path 12c. In the present embodiment, the valve seat 15 is fixed in the mounting groove by caulking.

Flow path 13 has one end opening at the bottom surface of the recess 11 of the valve body 10, and has at the other end an opening 13a which opens at the other side surface opposite to flow path 12 of the valve body 10, and a pipe joint 502 is connected to the opening 13a by welding.

Diaphragm 20 is disposed above the valve seat 15 and defines a flow path that communicates with flow path 12c and flow path 13, and the central portion thereof moves up and down to abut and separate from the valve seat 15, thereby opening and closing flow path 12 and 13. In the present embodiment, the diaphragm 20 is formed by bulging upward the central portion of a metal sheet and a nickel-cobalt alloy sheet such as special stainless steel, to have an upward arcuate convex upward spherical shell shape in the natural state. Three sheets of this special stainless steel sheet and a nickel-cobalt alloy sheet are laminated to form a diaphragm 20.

Outer peripheral edge portion of diaphragm 20 is placed on a protrusion formed in the bottom of the recess 11 of the valve body 10, the lower end portion of the bonnet 30 is inserted into the recess 11 and screwed with the threaded portion of the valve body 10, and thereby the outer peripheral edge portion of diaphragm 20 is pressed against the protruding portion side of the valve body 10 via a stainless steel alloy presser adapter 25, and is sandwiched and fixed in an airtight state. Incidentally, the nickel-cobalt alloy thin film is disposed on the gas-contacting side, but a diaphragm of other configuration can also be used.

Operating member 40 is a member for operating the diaphragm 20 so as to open and close a gateway between flow path 12 and flow path 13, that is formed in a substantially cylindrical shape, and the upper end side is open. Operating member 40 is fitted to the inner peripheral surface of the bonnet 30 via an O-ring OR (see FIGS. 1C, 1D), and is movably supported in the vertical directions A1 and A2.

Diaphragm presser 48 made of a synthetic resin such as polyimide and abutting the upper surface of the central portion of the diaphragm 20 is mounted on the lower end surface of operating member 40.

Coil spring 90 is provided between the upper surface of the flange portion 48a formed on the outer peripheral portion of the diaphragm presser 48 and the ceiling surface of the bonnet 30, and operating member 40 is constantly biased toward the downward A2 by the coil spring 90. Therefore, when the main actuator 60 is not operating, the diaphragm 20 is pressed against the valve seat 15 and the gateway between the flow path 12 and the flow path 13 is closed.

Disc spring 120 as an elastic member is provided between the lower surface of the actuator receiver 27 and the upper surface of the diaphragm presser 48.

Casing 50 is constituted by an upper casing member 51 and a lower casing member 52, and a screw of the lower end portion of the inner periphery of the lower casing member 52 is screwed into a screw of the upper end portion outer periphery of the bonnet 30. Further, a screw on the outer periphery of the upper end portion of the lower casing member 52 is screwed with a screw on the inner periphery of the lower end portion of the upper casing member 51.

An annular bulkhead 65 is fixed between the upper end portion of the lower casing member 52 and a facing surface 51f of the upper casing member 51 that faces the upper end portion. A gap between an inner peripheral surface of the bulkhead 65 and an outer peripheral surface of operating member 40, and a gap between an outer peripheral surface of the bulkhead 65 and an inner peripheral surface of the upper casing member 51 are sealed by respective O-rings OR.

The main actuator 60 has annular first to third pistons 61, 62, 63. The first to third pistons 61, 62, 63 are fitted to the outer peripheral surface of operating member 40, and are movable in the vertical directions A1, A2 together with operating member 40. Gaps between the inner peripheral surface of the first to third pistons 61, 62, 63 and the outer peripheral surface of operating member 40, and gaps between the outer peripheral surface of the first to third pistons 61, 62, 63 and the upper casing member 51, the lower casing member 52, the inner peripheral surface of the bonnet 30 are sealed by a plurality of O-rings OR.

As shown in FIGS. 1C and 1D, a cylindrical partition member 130 is fixed to the inner peripheral surface of operating member 40 so as to have a gap GP1 between the inner peripheral surface of operating member 40 and the inner partition surface. The gap GP1 is sealed by a plurality of O-rings OR1 to OR3 provided between the outer peripheral surface on the upper and lower end sides of the partition member 130 and the inner peripheral surface of the operating member 40, and that is a flow path of the compressed air G as a drive fluid. The flow path formed by the gap GP1 is arranged concentrically with the piezoelectric actuator 100. A gap GP2 is formed between the casing 101 and the partition member 130 of the piezoelectric actuator 100 to be described later.

As shown in FIG. 1D, pressure chambers C1 to C3 are formed on the lower surface sides of the first to third pistons 61, 62, and 63, respectively.

The operating member 40 is provided with flow passages 40h1, 40h2, 40h3 that penetrate in the radial direction at positions communicating with the pressure chambers C1, C2, C3. Each of the flow passages 40h1, 40h2, 40h3 is a plurality of passages formed at equal intervals in the circumferential direction of operating member 40. The flow passages 40h1, 40h2, 40h3 are each connected to the flow passages formed by the gap GP1.

The upper casing member 51 of the casing 50 is formed with a flow passage 50h which opens at the upper surface, extends in the vertical directions A1, A2, and communicates with the pressure chamber C1. A supply pipe 150 is connected to the opening of the flow passage 50h via a pipe joint 152. Thus, the compressed air G supplied from the supply pipe 150 is supplied to the pressure chambers C1, C2, and C3 through the flow passages described above.

A space SP above the first piston 61 in the casing 50 communicates with the atmosphere through the through hole of the adjustment body 70.

As shown in FIG. 1C, a limit switch 160 is installed on the casing 50, and a movable pin 161 passes through the casing 50 and contacts the upper surface of the first piston 61. The limit switch 160 detects the movement of the vertical directions A1, A2 of the first piston 61 (operating member 40) according to the movement of the movable pin 161.

Here, the operation of the piezoelectric actuator 100 will be described with reference to FIG. 2.

Piezoelectric actuator 100 incorporates a stacked piezoelectric element (not shown) in the cylindrical casing 101 shown in FIG. 2. The casing 101 is made of a metal such as stainless steel alloy, and an end surface of a hemispherical tip end portion 102 and an end surface of a base end portion 103 are closed. By applying a voltage and thereby extending the stacked piezoelectric element, the end surface of the tip end portion 102 side of the casing 101 is elastically deformed, and the hemispherical tip end portion 102 is displaced in the longitudinal direction. Assuming that the full stroke of the stacked piezoelectric elements is 2 d, the total length of the piezoelectric actuator 100 becomes L0 by previously applying a predetermined voltage V0 at which the elongation of the piezoelectric actuator 100 becomes d. Then, when applying a voltage higher than the predetermined voltage V0, the total length of the piezoelectric actuator 100 becomes L0+d at the maximum, and when applying a voltage lower than the predetermined voltage V0 (including no voltage), the total length of the piezoelectric actuator 100 is L0−d at the minimum. Therefore, it is possible to expand and contract the entire length from the tip end portion 102 to the base end portion 103 in the vertical directions A1, A2. In the present embodiment, the tip end portion 102 of the piezoelectric actuator 100 is hemispherical, but the present invention is not limited thereto, and the tip end portion may be a flat surface.

As shown in FIG. 1C and FIG. 1D, power supply to the piezoelectric actuator 100 is performed by a wiring 105. The wiring 105 is led out to the outside through the through-hole 70a of the adjusting body 70.

The vertical position of the base end portion 103 of the piezoelectric actuator 100 is defined by the lower end surface of the adjusting body 70 via an actuator presser 80 as shown in FIG. 1C and FIG. 1D. In the adjustment body 70, a threaded portion provided on the outer peripheral surface of the adjustment body 70 is screwed into a threaded hole formed in the upper portion of the casing 50, and by adjusting the position of the adjustment body 70 in the vertical directions A1, A2, the position of the piezoelectric actuator 100 in the vertical directions A1, A2 can be adjusted.

The tip end portion 102 of the piezoelectric actuator 100 is in contact with a conical receiving surface formed on the upper surface of the disk-shaped actuator receiver 27 as shown in FIG. 1. The actuator receiver 27 is movable in the vertical directions A1, A2.

The pressure regulator 200 has a primary side to which a supply pipe 203 is connected via a pipe joint 201, and a secondary side to which a pipe joint 151 provided at the tip end portion of the supply pipe 150 is connected.

The pressure regulator 200 is a well-known poppet valve type pressure regulator, which, although not described in detail, is controlled so that the high pressure compressed air G supplied through the supply pipe 203 is lowered to a desired pressure to thereby the pressure on the secondary side becomes a preset pressure. When there is a fluctuation due to pulsation or disturbance in the pressure of the compressed air G supplied through the supply pipe 203, this fluctuation is suppressed and output to the secondary side.

In the present embodiment, a poppet valve type pressure regulator is used, but other types of pressure regulators can be used. Further, not limited to pressure regulators, any mechanism such as a damping filter can be adopted as long as the mechanism suppresses the pressure fluctuation of the compressed air G supplied to the supply pipe 150.

FIG. 3 shows an example in which the valve device 1 according to the present embodiment is applied to a process gas control system of a semiconductor manufacturing apparatus.

Semiconductor manufacturing apparatus 1000 shown in FIG. 3 is a device for performing a semiconductor manufacturing process by, for example, the ALD method, 800 is a source of compressed air G, 810 is a source of process gases PG, 900A to 900C are fluid control devices, VA to VC are open-close valves, 1A to 1C are valve devices according to the present embodiment, and CHA to CHC are process chambers.

In the semiconductor manufacturing process by the ALD method, it is necessary to precisely adjust the flow rate of the process gas, and along with increase of the diameter of the substrate, it is also necessary to secure the flow rate of the process gas.

Fluid control devices 900A to 900C are each an integrated gas system that integrates a variety of fluid devices, such as a open-close valves, regulators, mass flow controllers, and the like, to deliver accurately metered process gases PG to the processing chambers CHA to CHC, respectively.

The valve devices 1A to 1C precisely control the flow rate of the process gases PG from fluid control devices 900A to 900C by opening and closing the diaphragm 20 and supply the process gases PG to the processing chambers CHA to CHC, respectively. The open-close valves VA to VC execute supply-stop of the compressed air G according to a control command in order to perform open/close operation of the valve devices 1A to 1C.

In the semiconductor manufacturing apparatus 1000 as described above, the compressed air G is supplied from a common supply source 800, but the open-close valves VA to VC are independently driven.

The compressed air G having a substantially constant pressure is constantly output from the common supply source 800, but when the open-close valves VA to VC are opened and closed independently, and due to the influence of e.g. pressure loss caused by open-close operation of the valves, the pressure of the compressed air G supplied to valve devices 1A to 1C fluctuates, and is not constant.

When the pressure of the compressed air G supplied to the valve devices 1A to 1C fluctuates, there is a possibility that the flow rate adjusting amount by the piezoelectric actuator 100 described above is varied. In order to solve this problem, the pressure regulator 200 described above is provided.

Next, with reference to FIGS. 4 to 6B, the operation of the valve device 1 according to the present embodiment will be described together with the operation of the pressure regulator 200.

FIG. 4 shows fully closed state of valve device 1. In the state shown in FIG. 4, the compressed air G is not supplied. In this state, the disc spring 120 is already compressed to some extent and elastically deformed, and the actuator receiver 27 is constantly urged in the upward direction A1 by the restoring force of the disc spring 120. As a result, the piezoelectric actuator 100 is constantly urged in the upward direction A1, and the upper surface of the base end portion 103 is pressed against actuator presser 80. Thus, the piezoelectric actuator 100 receives the compressive force in the vertical directions A1, A2 and is disposed at a predetermined position with respect to the valve body 10. Since the piezoelectric actuator 100 is not connected to any member, it is relatively movable in the vertical directions A1, A2 with respect to operating member 40.

The number and orientation of the disc springs 120 can be appropriately changed according to conditions. In addition, other elastic members such as coil springs, leaf springs, and the like can be used in addition to the disc springs 120, but the use of disc springs has an advantage of easy adjustment of spring stiffness, stroke, and the like.

As shown in FIG. 4, when the diaphragm 20 is in contact with the valve seat 15 and the valve is closed, a gap is formed between the regulating surface 27b of the lower surface side of the actuator receiver 27 and the abutting surface 48t of the upper surface side of diaphragm presser 48 of operating member 40. The position of the regulating surface 27b in the vertical directions A1, A2 is the open position OP in a state in which the opening degree is not adjusted. The distance between the regulating surface 27b and the abutting surface 48t corresponds to the lift amount Lf of the diaphragm 20. Lift amount Lf defines the opening degree of the valve, that is, the flow rate. The lift amount Lf can be changed by adjusting the position in the vertical directions A1, A2 of the adjustment body 70. The diaphragm presser 48 (operating member 40) in the condition shown in FIG. 4 is located at the closed position CP with reference to the abutting surface 48t. When the abutting surface 48t moves to a position where it contacts the regulating surface 27b of the actuator receiver 27, that is, to the open position OP, the diaphragm 20 is separated from the valve seat 15 by a lift amount Lf.

When the drive air G is supplied into the valve device 1 through the supply pipe 150, a thrust force that pushes operating member 40 upward in the direction A1 is generated in the main actuator 60 as shown in FIG. 5. The pressure of the drive air G is set enough to move operating member 40 in the upward direction A1 against the biasing force of the coil spring 90 and the disc spring 120 in the downward direction A2 acting on operating member 40. When such drive air G is supplied, as shown in FIG. 5, the operating member 40 moves upward A1 while further compressing the disc spring 120, the abutting surface 48t of diaphragm presser 48 abuts on the regulating surface 27b of the actuator receiver 27, and the actuator receiver 27 receives a force toward the upward A1 from the operating member 40. This force acts as a force to compress the piezoelectric actuator 100 in the vertical directions A1, A2 through the tip end portion 102 of the piezoelectric actuator 100. Accordingly, the force of the upward direction A1 acting on the operating member 40 is received at the tip end portion 102 of the piezoelectric actuator 100, and the movement of operating member 40 in the A1 direction is restricted in the open position OP. In this state, the diaphragm 20 is separated from the valve seat 15 by the lift amount Lf described above.

In this state, if the pressure of the drive air G supplied through the supply pipe 150 fluctuates greatly, the force in the upward direction A1 acting on the operating member 40 also fluctuates, and the piezoelectric actuator 100 deforms in the vertical directions A1, A2. When the piezoelectric actuator 100 is deformed in the vertical directions A1, A2, the lift amount Lf is changed and the flow rate is changed.

Pressure regulator 200 functions to suppress the fluctuation of the pressure of the drive air G so that the deformation of the piezoelectric actuator 100 in the vertical directions A1, A2 becomes within an allowable value.

If it is desired to adjust the flow rate of the fluid outputted from the valve device 1 in the state shown in FIG. 5, the piezoelectric actuator 100 is actuated.

Left side of the center line Ct in each of FIG. 6A and FIG. 6B shows the state shown in FIG. 5, and the right side of the center line Ct shows the state after adjusting the position of the vertical directions A1, A2 of the operating member 40.

When adjusting the flow rate of the fluid in the reducing direction, as shown in FIG. 6A, the piezoelectric actuator 100 is extended to move the operating member 40 in the downward direction A2. Thus, the lift amount Lf− after adjustment, which is the distance between the diaphragm 20 and the valve seat 15, becomes smaller than the lift amount Lf before adjustment. When adjusting the flow rate of the fluid in the increasing direction, as shown in FIG. 6B, the piezoelectric actuator 100 is shortened and the operation member 40 is moved in the upward direction A1.

When adjusting flow rate of the fluid in the increasing direction, as shown in FIG. 6B, the piezoelectric actuator 100 is shortened and the operating member 40 is moved in the upward direction A1. Thus, the lift amount Lf+ after adjustment, which is the distance between the diaphragm 20 and the valve seat 15, becomes larger than the lift amount Lf before adjustment.

The fluctuation in the pressure of the drive air G supplied through the supply pipe 150 also affects the adjustment amount of the piezoelectric actuator 100.

The pressure regulator 200 functions to suppress fluctuations in the pressure of the drive air G so that the error in the adjustment amount of the piezoelectric actuator 100 falls within the desired range.

In the present embodiment, the maximum value of the lift amount of the diaphragm 20 is about 100 to 200 μm, and the adjustment amount by the piezoelectric actuator 100 is about ±20 μm.

That is, in the stroke of the piezoelectric actuator 100, although it is not possible to cover the lift amount of the diaphragm 20, but by using the main actuator 60 operating with the drive air G and the piezoelectric actuator 100 in combination, while ensuring the flow rate supplied by the valve device 1 with the main actuator 60 having a relatively long stroke, it is possible to precisely adjust the flow rate by the piezoelectric actuator 100 having a relatively short stroke, and since it is not necessary to manually adjust the flow rate by the adjusting body 70 or the like, the flow rate adjustment man-hours are greatly reduced.

According to the present embodiment, since the flow rate can be precisely adjusted only by changing the voltage applied to the piezoelectric actuator 100, the flow rate adjustment can be immediately executed and the flow rate can be controlled in real time According to the present embodiment, by providing the pressure regulator 200, it is possible to suppress the occurrence of flow rate fluctuation due to the pressure fluctuation, and more precise flow control is realized.

According to this embodiment, since the pressure regulator 200 is fixed in place in the housing box 301, the distance and the internal volume from the pressure regulator 200 to the pressure chamber can be constant for each valve, more precise flow rate adjustment is possible. That is, although the flow rate is adjustable by the adjusting actuator 100, if the distance from the pressure regulator 200 to the pressure chamber and the internal volume therebetween are different for each valve, variations in the opening and closing speed of the diaphragm 20 occurs, and the supply amount of the process gas to be supplied to the processing chamber cannot be accurately controlled.

In the above embodiment, the pressure regulator 200 is provided in the housing box 301, but it can be installed on the supply path to the main actuator 60 outside the housing box 301. (Although the flow rate can be adjusted by the adjusting actuator, but if the distance and the internal volume from the regulator to the pressure chamber are different for each valve, variations in the "open-close speed" occur, which prevents accurate control of the supply amount of the process gas supplied to the processing chamber.) *The effect of claim 4

In the above embodiment, the piezoelectric actuator is used as the adjusting actuator, but it is not limited thereto. For example, an electric driving material made of a compound that deforms in response to a change in an electric field can be used as an actuator. The shape or size of the electrically driven material can be changed by electric current or the voltage to change the defined open position of the operating member 40. Such an electrically driven material may be a piezoelectric material or an electrically driven material other than the piezoelectric material. As an electrically driven material other than the piezoelectric material, an electrically driven type polymeric material can be used.

The electrically driven type polymeric materials, also referred to as electroactive polymer (EAP) materials, include, for example, electric EAP driven by an external electric field or Coulombic force, nonionic EAP in which a solvent that swells the polymer is flown by an electric field to deform the polymer, ionic EAP driven by movement of ions and molecules by an electric field, and the like, and any one or a combination thereof can be In the above embodiment, a so-called normally closed type valve is exemplified, but the present invention is not limited to this, and is also applicable to a normally open type valve. Also in this case, the opening of the valve body may be adjusted by the adjusting actuator.

In the above application example, valve device 1 is used in a semiconductor manufacturing process by the ALD method, but the present invention is not limited to this, and the present invention can be applied to any object requiring precise flow rate control, such as an atomic layer etching (ALE) method.

In the above embodiment, a piston incorporated in a cylinder chamber operated by a gas pressure is used as the main actuator, but the present invention is not limited thereto, and various optimum actuators can be selected according to objects to be controlled.

REFERENCE SIGNS LIST

1 Valve device
10 Valve body
11 Recess
12, 13 Flow path
15 Valve seat
20 Diaphragm (Valve element)
25 Presser adapter
27 Actuator receiver
30 Bonnet 40 Operating member
48 Diaphragm presser (operating member)
50 Casing
51 Upper casing member
52 Lower casing member
60 Main actuator
70 Adjusting body
80 Actuator presser
90 Coil spring
100 Piezoelectric actuator (adjusting actuator)
101 Casing
102 Tip end portion
103 Base end portion
120 Disc spring
150 Supply pipe
160 Limit switch
200 Pressure regulator
OR O-ring
G Compressed air (drive fluid)
Lf Lift amount before adjustment
Lf+, Lf− Lift amount after adjustment

The invention claimed is:

1. A valve device, comprising:
a valve body defining a flow path;
a valve element provided to open and close the flow path of the valve body;
a driven operator for operating the valve element, which is movably provided between an open position to make the valve element open the flow path and a close position to make the valve element close the flow path;
a main actuator for moving the driven operator to the open position or the closed position by receiving a pressure of a supplied drive fluid;
an adjusting actuator arranged to receive at least a part of a force generated by the main actuator, and for adjusting a position of the driven operator positioned at the open position; and
a pressure stabilizer provided in a supply path of the drive fluid to the main actuator and for suppressing fluctuation of pressure of the drive fluid to be supplied to the main actuator,
a casing incorporating the main actuator and the adjusting actuator, and
a flow passage formed in the casing and for supplying the drive fluid that has passed through the pressure stabilizer to the main actuator,
wherein the flow passage is formed separately so that the pressure of the drive fluid flowing through the flow passage does not act on the adjusting actuator,
the main actuator has an annular piston,
the adjusting actuator and the driven operator are arranged concentrically with the annular piston, and
the flow passage has a flow passage arranged concentrically with the adjusting actuator.

2. The valve device according to claim 1, wherein the pressure stabilizer includes a pressure regulator that regulates the pressure of the drive fluid to be supplied.

3. The valve device according to claim 1, wherein the main actuator moves the driven operator to the open position, and
the adjusting actuator receives the force of the main actuator acting on the driven operator positioned at the open position at the tip of the adjusting actuator to restrict the movement of the driven operator and adjust the position of the driven operator.

4. The valve device according to claim 1, wherein the adjusting actuator has a drive source that expands and contracts in response to supply of electricity.

5. The valve device according to claim 1, wherein the adjusting actuator comprises an actuator utilizing expansion and contraction of a piezoelectric element.

6. The valve device according to claim 5, wherein the adjusting actuator comprises a casing having a base end portion and a tip end portion, and a piezoelectric element accommodated in the casing and stacked between the base end portion and the tip end portion, and the entire length between the base end portion and the tip end portion of the casing is expanded and contracted by utilizing expansion and contraction of the piezoelectric element.

7. The valve device according to claim 1, wherein the adjusting actuator comprises an actuator having electrically driven polymer as a drive source.

* * * * *